# United States Patent [19]

Phillips, II

[11] Patent Number: 5,239,135
[45] Date of Patent: Aug. 24, 1993

[54] CIRCUIT BOARD FASTENER

[75] Inventor: Ronald W. Phillips, II, Sellersville, Pa.

[73] Assignee: Penn Engineering & Manufacturing Corp., Danboro, Pa.

[21] Appl. No.: 835,376

[22] Filed: Feb. 14, 1992

[51] Int. Cl.$^5$ .............................................. H05K 1/00
[52] U.S. Cl. ...................................... 174/267; 439/82; 439/84
[58] Field of Search .................... 174/267, 266, 264; 439/65, 66, 76, 78, 82, 84

[56] References Cited

U.S. PATENT DOCUMENTS 3,945,703  3/1976  McCormick.
4,402,135  9/1983  Schweingruber et al..
4,792,646  12/1988  Enomoto.

Primary Examiner—Leo P. Picard
Assistant Examiner—Cheryl R. Figlin
Attorney, Agent, or Firm—Gregory J. Gore

[57] ABSTRACT

A press-in type fastener for mounting circuit board components or circuit boards to a chassis grips a through-hole in the circuit board by radial expansion of the shank. The fastener has a head and a shank with smooth parallel sides and a length substantially equivalent to, but greater than the thickness of the circuit board. The fastener includes a through-bore which is tapered in the area of the shank. After being loosely inserted into a pre-drilled circuit board mounting hole, the fastener is pressed between a punch and an opposing anvil which expands the fastener shank due to the axial compression of the fastener. The anvil has a substantially planar face which abuts the underside of the circuit board and, therefore, no part of the fastener protrudes through the opposite side of the board of the installation. The fastener may be headed and include teeth which extend axially from the underside of the fastener head for gripping the top side of the circuit board to provide torque resistance. The fastener through-bore preferably includes a threaded section in the region of the head.

12 Claims, 1 Drawing Sheet

CIRCUIT BOARD FASTENER

FIELD OF THE INVENTION

This invention relates to means for creating a strong mechanical connection between electronic components, such as transformers, heat sinks, relays, and other circuit boards to a circuit board, or a circuit board to a chassis. More specifically, this invention relates to a fastening system used in conjunction with a circuit board having plated through-holes.

BACKGROUND OF THE INVENTION AND DESCRIPTION OF PRIOR ART

Various fastening systems have been devised to mount electronic components to circuit boards. In one example, the mounts include threaded studs which are soldered directly to the circuit board after being inserted into holes in the board. Other systems include the use of a broaching-type fastener in which the shank of the fastener includes longitudinal splines, which pierce and wedge into the sidewalls of pre-drilled holes in the board to secure the fastener to the board. Both studs having external male threads and nuts with threaded bores have been used in the past as circuit board mounting devices. Rivet-type fasteners with a fluted shank flared over the back side of the circuit board have been tried but are not commonly employed because the flared-over end of the fastener may present an obstruction to components or circuits on the opposite side of the board.

The soldered-in type fasteners require that the fasteners be placed on the board either before board soldering or require an additional soldering step after the fastener is inserted into the board. Broaching-type fasteners place unwanted high insertion pressures on the board when they are pressed in. This often causes the board to crack and the need for placing attachment holes away from the edge of the board. Therefore, their use is restricted to thicker circuit boards and placement a safe distance from the edge of the board. Furthermore, they cannot be used with boards which are made of brittle materials.

Another problem with broaching-type fasteners occurs when they are used with plated through-holes. The fastener mounting hole is often plated with a thin coating of electrically conductive material to form an electrical connection between opposite sides of the board. When a broaching-type fastener is used in a plated through-hole, the splines on the shank of the fastener which cut into the board often cut away much of the plating on the inner walls of the through-hole. This adversely affects the quality of the electrically-conductive properties of the through-hole plating.

The closest prior art of which the applicant is aware are U.S. Pat. No. 4,110,904, entitled "Substrate with Terminal Connections and Method of Making the Same", issued to Samuel B. Johnson on Sept. 5, 1978; U.S. Pat. No. 4,911,592, entitled "Method of Installation and Installation Apparatus", issued to Rudolph R.M. Muller on Mar. 27, 1990; and, U.S. Pat. No. 3,659,245, entitled "Variable Resistor Pin Terminal and Method", issued to Robert L. Payne on Apr. 25, 1972. These prior art references are pertinent in that they show fasteners and fastening methods similar to the present invention, however, neither reference teaches or suggests its novel and unobvious features of the present invention.

There is, therefore, a need for a simple, press-in type circuit board fastener which can be used with thin circuit boards of any material, and which will not adversely affect the electrical properties of plated through-holes into which they are inserted. There is a further need for a circuit board fastener which may be inserted by a pressing force, but which does not overly stress the circuit board so that it may be used with relatively thin board and located close to the edge. It is the object of the present invention to provide a circuit board fastener which fulfills these and other unsatisfied needs in the circuit board arts.

SUMMARY OF THE INVENTION

In order to solve the problems in the circuit board fastening art described above, the present fastener has been devised which permits a rigid, mechanical connection of electronic components to circuit boards, or circuit boards to a mounting chassis. The fastener of the present invention combines the properties of a press-in type fastener, but grips the through-hole of the circuit board primarily by radial expansion of a specially designed shank, rather than cutting into the circuit board material. After being loosely inserted into a pre-drilled mounting hole, the fastener is pressed between a punch and opposing anvil and fastener shank expands due to axial compression of the fastener. The anvil has a substantially planar face abutting the underside of the panel. The fastener prior to installation has a head and a shank with smooth parallel sides and a length substantially equivalent to, but greater than, the thickness of the circuit board.

As the fastener is pressed into the board, axially extending teeth from the shoulder on the bottom side of the fastener head embed into the top surface of the board. Before the circuit board can be compressed further by force of the fastener head, the end of the shank bottoms against the anvil. Yet greater force applied to the fastener causes the shank of the fastener to spread within the hole, thereby gripping the plated sidewalls of the hole without substantially increasing the bending force on the circuit board. Because the expansion of the shank is greatest at its end due to the tapered inner bore, the circuit board material around the hole is elastically deformed and trapped between the shoulder formed by the bottom of the head of the fastener and the end of the shank, thus providing a resistance to pull out. The teeth which embed into the top side of the circuit board provide the required torque-out resistance. The fastener preferably includes a threaded internal bore in the head which can receive threaded screws for attachment of various electronic components or chassis attachment as desired.

More specifically, the applicant has devised a panel and fastener assembly, comprising: a non-metallic panel having a thickness, opposing top and bottom sides, and at least one cylindrical hole extending through the entire thickness, said hole having an inner wall and an axis substantially perpendicular to the opposing sides; and a fastener inserted into said hole, said fastener having a cylindrical shank with smooth, parallel sides and an axial bore tapered continuously between opposite ends of the shank, the free end of the shank being at least flush with the bottom side of the panel. The fastener further includes a head at one end of the shank and a shoulder on the underside of the head which abuts the top side of the panel after it is installed. The shoulder further includes a plurality of teeth which extend axially away from the head. The fastener is assembled to the circuit board by pressing the head of the fastener into the panel against an anvil which has a substantially planar face abutting the underside of the panel, whereby the pressing first causes the teeth to embed into the front side of the panel and then causes the radial flaring of the shank when the free end of the fastener contacts the anvil.

Because the sides of the shank are smooth, there is no sharp deformation or unwanted cutting of the plating on the inner sides of the through-hole as the fastener is applied to the circuit board. During pressing, the shank of the fastener does not expand radially until it is inserted to its maximum depth and, therefore, there is no longitudinal shearing motion between the shank of the fastener and the inner wall of the through-hole. The radial flaring of the shank presses the fastener against the inner wall of the hole in a direction substantially normal to the surface of the inner wall of the hole.

BRIEF DESCRIPTION OF THE PREFERRED EMBODIMENT

Figure 1:
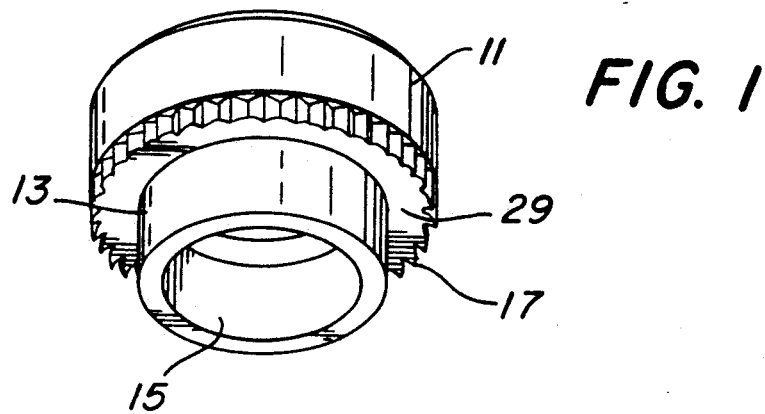
FIG. 1 is a front bottom isometric view of the present invention.

Referring now to FIG. 1, the fastener of the present invention is shown as viewed from the front and bottom looking at the free end of the shank 13. The shank includes a tapered bore 15 which is more clearly shown in the sectional view of FIG. 2 and extends to a larger diameter head 11 creating an angular shoulder 29 on the underside of the head. The shoulder includes a plurality of teeth 17 located around its periphery.

Figure 2:
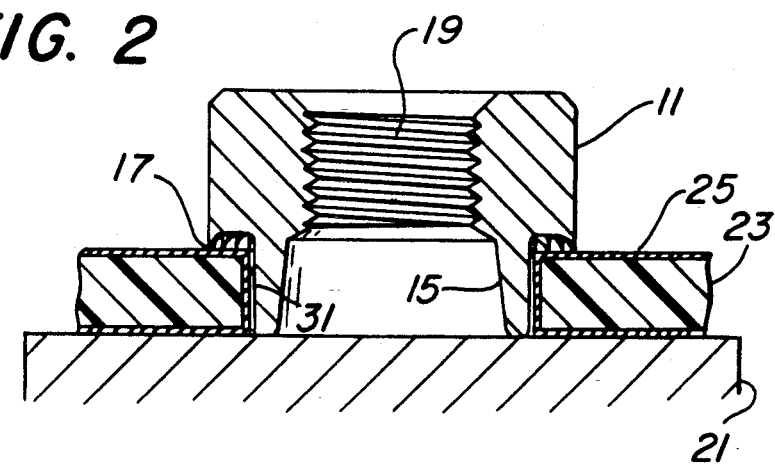
FIG. 2 is a side sectional view of the fastener invention prior to installation.

Referring now to FIG. 2, the fastener of the preferred embodiment includes a bore which extends through the entire length of the fastener and which is threaded in the region of the head 11 represented by threads 19 in this figure. As shown in this figure, prior to installation, the fastener is loosely fitted within an aperture in circuit board 23 with both the circuit board and fastener resting upon anvil 21. As shown in this embodiment, the circuit board 23 includes a surface plating 25 which is continuous from the top to the undersides of the circuit board. An electrical circuit is thus established between both sides of the circuit board through the plating of material on the inner wall 31 of the hole through the circuit board. As shown in this figure, the length of the shank of the fastener is approximately equal to the width of the circuit board. Therefore, the teeth 17 around the periphery of the shoulder of the fastener rest on the top surface of the circuit board as the free end of the shank rests on the top of the anvil 21.

Figure 3:
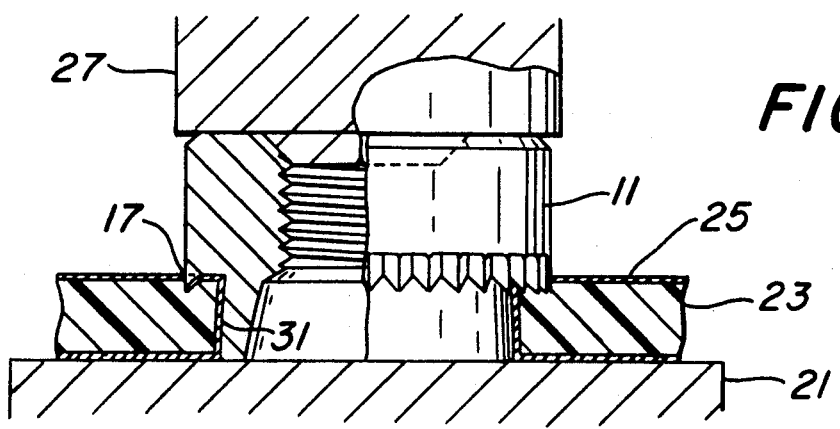
FIG. 3 is a side sectional view as shown in FIG. 2, but after the fastener has been installed.

Referring now to FIG. 3, the fastener is applied to the circuit board by axial compression of the fastener. Punch 27 applies a downward pressing force against the top of the fastener, thus compressing the fastener against the anvil 21. Simultaneously, teeth 17 embed into the top surface of the circuit board. The fastener in this figure is shown fully inserted into circuit board 23. Both the shank of the fastener and the inner wall of the circuit board deform as the shank is expanded radially. Applied in this way, the outer surface of the shank is radially flared against and grips the inner wall 31 of the hole in the circuit board without any longitudinal shearing motion, thus the plating 25 is not broken. After installation, the fastener is rigidly installed into circuit board 23 with the teeth 17 providing torque out resistance. The elastic deformation of circuit board 23 being trapped between the flange and the flared free end of the shank provides the desired pullout resistance.

The features of the invention described above make the use of the present fastening system extremely easy and practical. Because both sides of the shank and the circuit board hole are smooth and cylindrical, centering of the fastener in the hole prior to pressing is achieved with a loosely fitting tolerance. No special preparation of the circuit board aperture is required and a simple cylindrical drilled hole without the need for additional preparation, such as chamfering, is preferred. This provides the greatest amount of surface area between the inner wall of the through-hole and the sides of the shank. Furthermore, the pressing operation may be carried out with a simple, flat anvil and no special tooling. This contributes to the ease of installation, since no particular alignment between the board and the anvil is required.

Thus, the objects of the present invention to create a circuit board fastener which may be inserted by a pressing force but which does not overly stress the circuit board or diminish the electrical properties of the plated through-hole into which it is inserted is fulfilled. It should be readily understood that the only forces on the circuit board created by the installation of the fastener is the force required for the shoulder teeth to embed into the top side of the circuit board. This force is very small and, therefore, fasteners constructed and installed according to the present invention may be used close to the edge of the circuit board, and further may be used in conjunction with circuit boards made of brittle materials. For example, the recommended installation force of a #6–32 size fastener is 3,300 lbs. However, the force required to fully embed the teeth is only 1,200 lbs. The shank is a maximum diameter of 0.212 inches, and the installation hole is a minimum of 0.213 inches, so no shearing force is applied to the walls of the hole as the fastener passes through. When used in typical glass fiber reinforced printed circuit board, the fastener can be made from steel or stainless steel, and can be installed on a centerline only 0.175 inch from the edge of the printed circuit board. The fastener presents no obstruction to components or circuits on the bottom of the board.

Although the above preferred embodiment shows the application of the present fastener assembly utilizing a circuit board, it should be understood that the above-described fastener may be used with other types of mounting panels used elsewhere in the electrical arts. For example, the fastener of the present invention may be used in a connector support panel, or in other applications where the panel into which the fastener is installed may be either metallic or non-metallic.

It should be understood that the above description discloses specific embodiments of the present invention and are for purposes of illustration only. There may be other modifications and changes obvious to those of ordinary skill in the art which fall within the scope of the present invention which should be limited only by the following claims and their legal equivalents.

What is claimed is:

1. A panel and fastener assembly, comprising:

a panel having a width, a top side, an opposing bottom side, and a hole extending through the entire width, said hole having a cylindrical inner wall and a longitudinal axis substantially perpendicular to the opposing sides; and a headed fastener inserted into said hole from the top side of said panel, said fastener having a cylindrical shank with a smooth outer surface and a tapered internal axial bore diverging in the direction of a free end of the shank, the free end of the shank being flush with the bottom side of the panel after insertion.

2. The panel and fastener assembly of claim 1, wherein the sides of said shank are deformed by axial compression of the fastener during insertion, thereby expanding against and gripping said inner wall of the panel.

3. The panel and fastener assembly of claim 2, wherein said fastener further includes a shoulder which abuts the top side of said panel.

4. The panel and fastener assembly of claim 3, wherein said hole includes metal plating on the inner wall.

5. The panel and fastener assembly of claim 4, wherein said fastener is composed of a metal harder than the metal plating.

6. The panel and fastener assembly of claim 5, wherein said shoulder further includes a plurality of teeth extending axially from said shoulder.

7. The panel and fastener assembly of claim 6, wherein said fastener is further described in that the internal bore extends the entire length of the fastener.

8. The panel and fastener assembly of claim 7, wherein said
internal bore is threaded.

9. The panel and fastener assembly of claim 8, wherein said panel is a circuit board and the hole is plated with an electrically conductive material.

10. The method of creating a panel and fastener assembly comprising:
the step of pressing a head of the fastener into the panel against an anvil which has a substantially planar face abutting a bottom side of the panel, whereby said pressing simultaneously causes the teeth to bite into the top side of the panel and causes the radial expansion of the shank.

11. A fastener, comprising:
a cylindrical shank with smooth parallel sides and an axial bore extending therethrough;
a head at one end of said shank, said head having a diameter greater than the diameter of the shank thereby creating a shoulder on the bottom side of said head;
a plurality of teeth extending axially from said shoulder toward an opposite end of said shank; and
the bore being threaded along a first portion of its length in the region of the head and tapered along an entire second unthreaded portion of its length, said taper being divergent toward the opposite end of said shank.

12. A panel and fastener assembly, comprising:
a non-metallic panel having a width, a top side, an opposing bottom side, and a hole extending through the entire width, said hole having a cylindrical inner wall and a longitudinal axis substantially perpendicular to the opposing sides;
a headed fastener inserted into said hole from the top side of said panel, said fastener having a cylindrical shank with a smooth outer surface and a tapered internal axial bore diverging in the direction of a free end of the shank, the free end of the shank being flush with the bottom side of the panel after insertion; and
a shoulder on the underside of the head, including a plurality of axially-extending teeth located around its periphery.

* * * * *